(12) United States Patent
Brink et al.

(10) Patent No.: US 9,437,443 B2
(45) Date of Patent: Sep. 6, 2016

(54) LOW-TEMPERATURE SIDEWALL IMAGE TRANSFER PROCESS USING ALD METALS, METAL OXIDES AND METAL NITRIDES

(71) Applicant: GLOBALFOUNDRIES INC., Grand Cayman (KY)

(72) Inventors: Markus Brink, White Plains, NY (US); Michael A. Guillorn, Yorktown Heights, NY (US); Sebastian U. Engelmann, New York, NY (US); Hiroyuki Miyazoe, White Plains, NY (US); Adam M. Pyzyna, Cortlandt Manor, NY (US); Jeffrey W. Sleight, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 84 days.

(21) Appl. No.: 13/916,109

(22) Filed: Jun. 12, 2013

(65) Prior Publication Data

US 2014/0367833 A1 Dec. 18, 2014

(51) Int. Cl.
| | |
|---|---|
| *H01L 21/308* | (2006.01) |
| *H01L 21/033* | (2006.01) |
| *H01L 21/02* | (2006.01) |
| *H01L 21/3213* | (2006.01) |
| *H01L 21/28* | (2006.01) |

(52) U.S. Cl.
CPC ....... *H01L 21/3086* (2013.01); *H01L 21/0228* (2013.01); *H01L 21/0337* (2013.01); *H01L 21/0338* (2013.01); *H01L 21/3088* (2013.01); *H01L 21/32139* (2013.01); *H01L 21/28132* (2013.01)

(58) Field of Classification Search
None
See application file for complete search history.

(56) References Cited

U.S. PATENT DOCUMENTS

| 4,838,991 | A | 6/1989 | Cote et al. | |
|---|---|---|---|---|
| 6,982,221 | B1 * | 1/2006 | Hsu | 438/618 |
| 7,732,343 | B2 | 6/2010 | Niroomand et al. | |
| 7,902,074 | B2 | 3/2011 | Niroomand et al. | |
| 8,030,217 | B2 | 10/2011 | Niroomand et al. | |
| 2001/0051444 | A1* | 12/2001 | Lim et al. | 438/778 |
| 2006/0046200 | A1* | 3/2006 | Abatchev et al. | 430/313 |
| 2006/0046422 | A1* | 3/2006 | Tran | H01L 21/0337 438/401 |
| 2007/0049040 | A1* | 3/2007 | Bai et al. | 438/712 |
| 2008/0076070 | A1 | 3/2008 | Koh et al. | |

(Continued)

OTHER PUBLICATIONS

H. Kim and S.M. Rossnagal, J. Vac. Sci. Tech. A. vol. 20, year 2002, pp. 802-808.*

*Primary Examiner* — Jiong-Ping Lu
(74) *Attorney, Agent, or Firm* — Anthony Canale; Andrew M. Calderon; Roberts Mlotkowski Safran Cole & Calderon P.C.

(57) ABSTRACT

A SIT method includes the following steps. An SIT mandrel material is deposited onto a substrate and formed into a plurality of SIT mandrels. A spacer material is conformally deposited onto the substrate covering a top and sides of each of the SIT mandrels. Atomic Layer Deposition (ALD) is used to deposit the SIT spacer at low temperatures. The spacer material is selected from the group including a metal, a metal oxide, a metal nitride and combinations including at least one of the foregoing materials. The spacer material is removed from all but the sides of each of the SIT mandrels to form SIT sidewall spacers on the sides of each of the SIT mandrels. The SIT mandrels are removed selective to the SIT sidewall spacers revealing a pattern of the SIT sidewall spacers. The pattern of the SIT sidewall spacers is transferred to the underlying stack or substrate.

19 Claims, 7 Drawing Sheets

(56) References Cited

U.S. PATENT DOCUMENTS

| | | |
|---|---|---|
| 2008/0122125 A1 | 5/2008 | Zhou |
| 2010/0216307 A1 | 8/2010 | Niroomand et al. |
| 2011/0033786 A1 | 2/2011 | Sandhu |
| 2011/0111596 A1 | 5/2011 | Kanakasabapathy |
| 2011/0316114 A1 | 12/2011 | Niroomand et al. |
| 2012/0108068 A1 | 5/2012 | Lytle |

* cited by examiner

LOW-TEMPERATURE SIDEWALL IMAGE TRANSFER PROCESS USING ALD METALS, METAL OXIDES AND METAL NITRIDES

FIELD OF THE INVENTION

The present invention relates to a Sidewall Image Transfer (SIT) process and more particularly, to SIT techniques using atomic layer deposition (ALD) metals, metal oxide and/or metal nitrides.

BACKGROUND OF THE INVENTION

Sidewall Image Transfer (SIT) is a process module that doubles the density of a line pattern and is thereby very important to continued silicon technology scaling. The SIT module conventionally involves the conformal deposition of a SIT spacer (for example, silicon nitride) over a previously patterned SIT mandrel at high temperatures. This high temperature deposition severely limits the use of SIT.

Specifically, due to the high processing temperatures in conventional SIT, only high-temperature-compatible materials may be used prior to the SIT steps being performed. Similarly, only high-temperature-compatible mandrels can be used as part of the SIT module. Accordingly, SIT can only be integrated into otherwise high-temperature compatible process flows, for example, excluding SIT from back-end of the line (BEOL) patterning.

Therefore, improved SIT techniques that avoid the high-temperature-compatibility problems described above would be desirable.

SUMMARY OF THE INVENTION

The present invention relates to Sidewall Image Transfer (SIT) techniques using atomic layer deposition (ALD) metals, metal oxide and/or metal nitrides. In one aspect of the invention, a SIT method is provided. The method includes the following steps. A SIT mandrel material is deposited onto a substrate. A patterned resist is formed on the SIT mandrel material, wherein the patterned resist has a line pattern defined therein. The line pattern from the patterned resist is transferred to the SIT mandrel material, forming a plurality of SIT mandrels. A spacer material is conformally deposited onto the substrate covering a top and sides of each of the SIT mandrels. The spacer material is selected from the group including a metal, a metal oxide, a metal nitride and combinations including at least one of the foregoing materials. The spacer material is removed from all but the sides of each of the SIT mandrels to form SIT sidewall spacers on the sides of each of the SIT mandrels. The SIT mandrels are removed selective to the SIT sidewall spacers revealing a pattern of the SIT sidewall spacers. The pattern of the SIT sidewall spacers is transferred to the substrate.

In another aspect of the invention, another SIT method is provided. The method includes the following steps. A SIT mandrel material is deposited onto a stack of thin films. A patterned resist is formed on the SIT mandrel material, wherein the patterned resist has a line pattern defined therein. The line pattern is transferred from the patterned resist to the SIT mandrel material, forming a plurality of SIT mandrels. A spacer material is conformally deposited onto the substrate covering a top and sides of each of the SIT mandrels, wherein the spacer material is selected from the group consisting of a metal, a metal oxide, a metal nitride and combinations comprising at least one of the foregoing materials. The spacer material is removed from all but the sides of each of the SIT mandrels to form SIT sidewall spacers on the sides of each of the SIT mandrels. The SIT mandrels are removed selective to the SIT sidewall spacers revealing a pattern of the SIT sidewall spacers. The pattern of the SIT sidewall spacers is transferred to one or more layers in the stack of thin films.

A more complete understanding of the present invention, as well as further features and advantages of the present invention, will be obtained by reference to the following detailed description and drawings.

DETAILED DESCRIPTION OF PREFERRED EMBODIMENTS

Provided herein are Sidewall Image Transfer (SIT) techniques which overcome the high-temperature-compatibility limitations associated with conventional processes, as described above. Specifically, the present process employs metals, metal oxides and/or metal nitrides as SIT spacers, which are deposited at a low temperature by atomic layer deposition (ALD).

The present techniques are now described in detail by way of reference to FIGS. 1-13. SIT, which is also referred to as Self-Aligned Double Patterning (SADP), is a process that is often employed for sub-lithographic patterning extension, for example, in logic and memory chip manufacturing. Other sub-lithographic patterning techniques include, but are not limited to, pitch split techniques, such as tone-inversion pitch split (TIPS), directed self-assembly (DSA), etc.

SIT is used to increase line pattern density beyond lithographic capabilities. For example, SIT line pitch=½×lithographic line pitch. A byproduct of the SIT process is that at a smaller pitch you also need smaller line width, thus SIT increases resolution. The SIT process flow increases complexity over straight lithography (with unique pattern faults).

A semiconductor device fabrication process flow typically begins with a wafer or other suitable substrate. Typical wafer configurations include, but are not limited to, silicon-on-insulator (SOI) wafers, bulk semiconductor wafers, wafers with a sequence of thin films (stack) deposited, etc. A SOI wafer includes a SOI layer separated from a substrate by a buried oxide or BOX. Any desired processing of the wafer that may be required prior to the SIT module is then performed. Of course, the particular processing steps are application-specific. However, for illustrative purposes only, the wafer may be processed, one or more active areas may be defined in the wafer, dopants may be implanted, etc. Any application-specific pre-processing steps would be apparent to one skilled in the art and thus are not described further herein.

Figure 1:
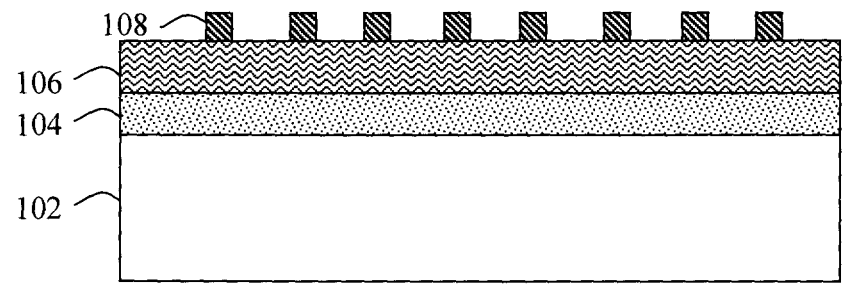
FIG. 1 is a cross-sectional diagram illustrating a starting structure for the present Sidewall Image Transfer (SIT) process including a substrate (or stack), a hardmask material on the substrate (or stack), a SIT mandrel material on the hardmask material, and a patterned resist on the SIT mandrel material according to an embodiment of the present invention.

The starting structure for the present SIT process flow is generally referred to herein as substrate 102. It is to be understood that substrate 102 generically represents any of the wafer/substrate configurations described above, and that pre-processing of the substrate, as described above, may have been performed. As shown in FIG. 1, a thin film of a hardmask material 104 is first deposited onto the substrate 102. According to an exemplary embodiment, hardmask material 104 is formed from a nitride material, such as silicon nitride, that is deposited to a thickness of from about 5 nanometers (nm) to about 20 nm using a deposition process such as chemical vapor deposition (CVD), physical vapor deposition (PVD), atomic layer deposition (ALD), evaporation, or spin-coating. It is notable that the use of a hardmask material in this example is optional. Specifically, a hardmask is often used to extend an etch budget (in this case of the SIT spacer) or inserted between two chemically similar films to obtain orthogonal etch chemistries. For instance, as described below, the present process can be used to pattern the hardmask, which in turn can be used to pattern the underlying substrate. However, in the instance where a hardmask is not used, then the SIT spacer material can serve to pattern the substrate directly by the present techniques.

Next, as shown in FIG. 1, a thin film of an SIT mandrel material 106 is then deposited onto the hardmask material 104. According to an exemplary embodiment, SIT mandrel material 106 is formed from an oxide material, such as silicon oxide, that is deposited to a thickness of from about 10 nm to about 100 nm using a deposition process such as CVD, PVD, ALD, evaporation, or spin-coating.

Figure 2:
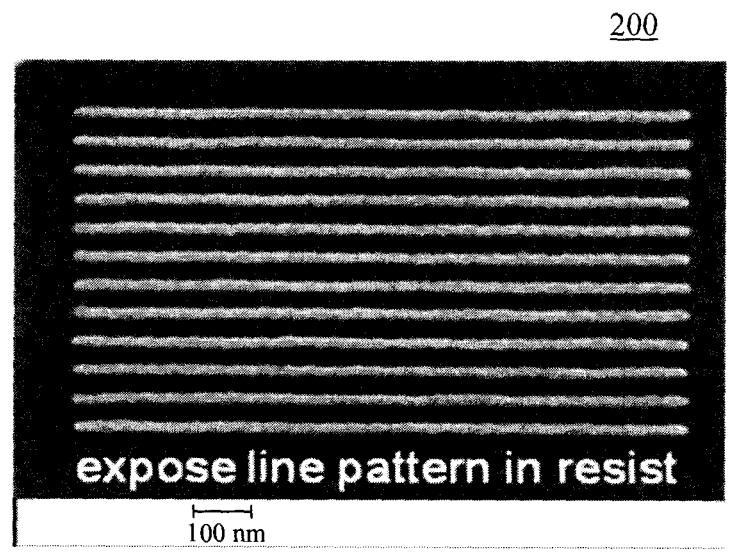
FIG. 2 is a top-down image of the starting structure illustrating the patterned resist having a line pattern defined therein according to an embodiment of the present invention.

A patterned resist 108 is then formed on the SIT mandrel material 106. See FIG. 1. The patterned resist 108 can be formed using standard lithography techniques. By way of example only, the wafer is first coated with a resist material (i.e., on the SIT mandrel material 106). The resist material is exposed using a lithography tool, and then developed. As shown in FIG. 2, described below, the resulting patterned resist 108 will have a line pattern defined therein.

FIG. 2 is a top-down image 200 of the device structure following deposition of the hardmask material, the SIT mandrel material and the patterned resist. As shown in FIG. 2, the patterned resist has an exposed line pattern defined therein.

Figure 3:
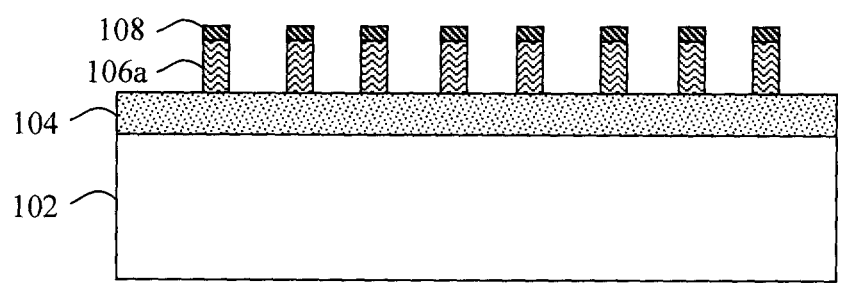
FIG. 3 is a cross-sectional diagram illustrating the line pattern from the patterned resist having been transferred to the SIT mandrel material forming SIT mandrels according to an embodiment of the present invention.
Figure 4:
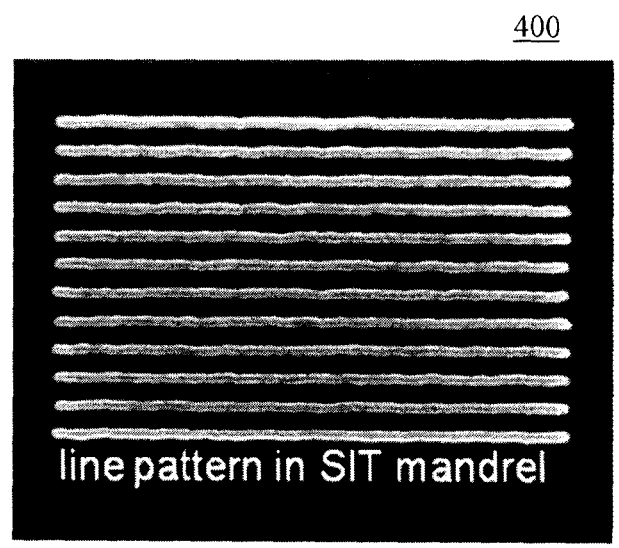
FIG. 4 is a top-down image of the starting structure illustrating the line pattern from the patterned resist having been transferred to the SIT mandrel material forming the SIT mandrels according to an embodiment of the present invention.
Figure 5:
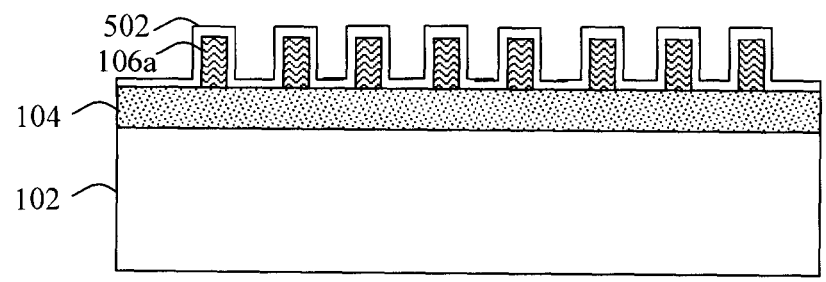
FIG. 5 is a cross-sectional diagram illustrating a conformal film of spacer material having been deposited on the wafer covering a top and sides of each of the SIT mandrels and exposed surfaces of the hardmask material according to an embodiment of the present invention.

The line pattern from the patterned resist 108 is transferred to the SIT mandrel material 106 forming SIT mandrels 106a. According to an exemplary embodiment, this patterning step is carried out using reactive ion etching (RIE). RIE will likely remove some (as shown in FIG. 3), or all of the patterned resist 108. If any portion of the patterned resist is remaining, it is preferably removed at this point in the process. FIG. 4 is a top-down image 400 of the line pattern from the patterned resist having been transferred to the SIT mandrel material forming the SIT mandrels.

A conformal film of spacer material 502 is then deposited on the wafer covering a top and sides of each of the SIT mandrels 106a and exposed surfaces of the hardmask material 104. See FIG. 5. According to an exemplary embodiment, the spacer material 502 is formed from a metal, a metal oxide, a metal nitride, or a combination including at least one of the foregoing materials, that is deposited to a thickness of from about 2 nm to about 20 nm using ALD at a temperature of less than or equal to about 550° C., for example, less than or equal to about 350° C., e.g., from about 200° C. to about 350° C. Advantageously, use of these "low-temperature" deposited materials avoids the temperature-compatibility problems described above, thus expanding the availability of materials that can be used prior to (and during) the SIT process.

Figure 6:
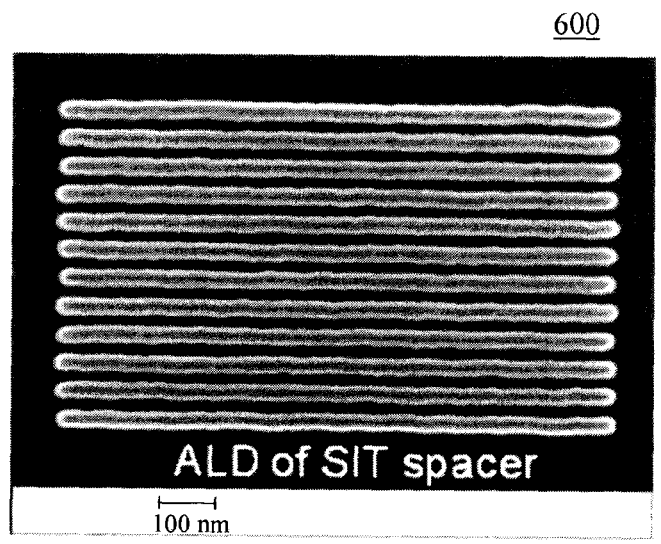
FIG. 6 is a top-down image of the spacer material having been deposited using atomic layer deposition (ALD) onto the top and sides of each of the SIT mandrels according to an embodiment of the present invention.
Figure 7:
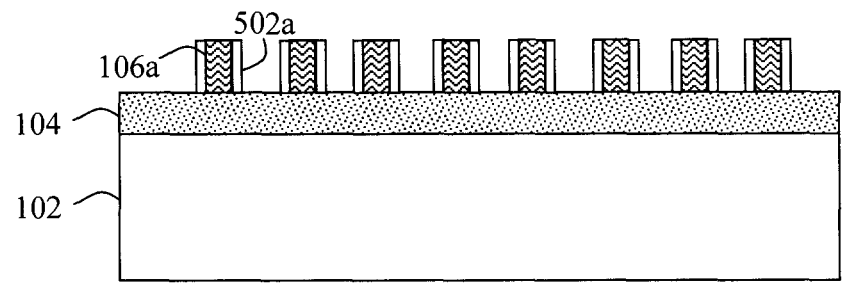
FIG. 7 is a cross-sectional diagram illustrating an anisotropic etch having been used to remove the spacer material from the top and the bottom of each of the SIT mandrels according to an embodiment of the present invention.

Suitable metals for use as spacer material 502 include, but are not limited to, platinum, ruthenium, molybdenum, iron, nickel, and combinations including at least one of the foregoing metals. Suitable metal oxides for use as spacer material 502 include, but are not limited to, aluminum oxide, titanium oxide, tantalum oxide, hafnium oxide, zirconium oxide, tin oxide, zinc oxide, magnesium oxide, niobium oxide, lanthanum oxide, cobalt oxide, and combinations including at least one of the foregoing metal oxides. Suitable metal nitrides for use as spacer material 502 include, but are not limited to, titanium nitride, tantalum nitride, hafnium nitride, zirconium nitride, tungsten nitride, niobium nitride, and combinations including at least one of the foregoing metal nitrides. FIG. 6 is a top-down image 600 of the spacer material having been deposited using ALD onto the top and sides of each of the SIT mandrels.

An anisotropic etch is used to remove the spacer material 502 from the top and the bottom of each of the SIT mandrels 106a. See FIG. 7. By the bottom of the SIT mandrels 106a it is meant that the spacer material (based on the example shown in the FIG. 7) is removed from the surfaces of the hardmask material 104. As a result of using an anisotropic etching process, the spacer material will remain intact on the sides of each of the SIT mandrels 106a. This spacer material on the sides of the SIT mandrels 106a will be referred to hereinafter as SIT sidewall spacers 502a. A suitable anisotropic etching process includes, but is not limited to, a RIE process.

Figure 8:
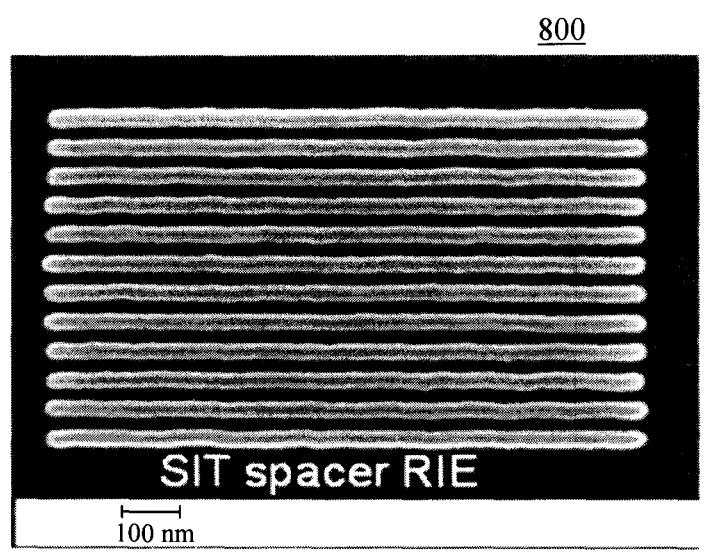
FIG. 8 is a top-down image of the spacer material having been removed from the top and the bottom of each of the SIT mandrels according to an embodiment of the present invention.
Figure 9:
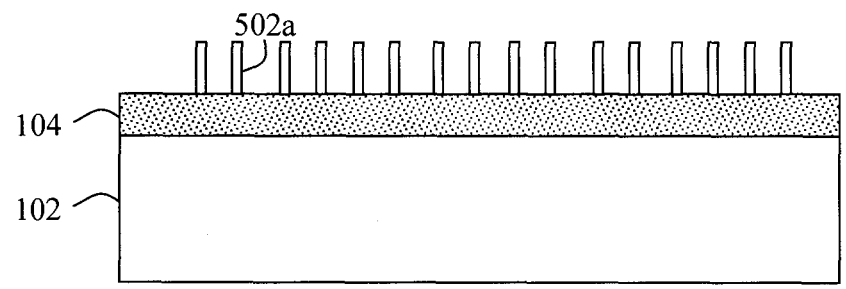
FIG. 9 is a cross-sectional diagram illustrating the SIT mandrels having been removed selective to the SIT sidewall spacers according to an embodiment of the present invention.

FIG. 8 is a top-down image 800 of the spacer material having been removed from the top and the bottom of each of the SIT mandrels. As shown in FIG. 8, the spacer material remains intact on the side of each of the SIT mandrels, forming the SIT sidewall spacers 502a.

The SIT mandrels 106a are then removed selective to the SIT sidewall spacers 502a. See FIG. 9. According to an exemplary embodiment, the SIT mandrels 106a are removed using a wet etching or dry etching process. The result is that a pattern of the SIT sidewall spacers 502a is revealed. That pattern will be used to pattern the underlying stack or substrate—see below.

Figure 10:
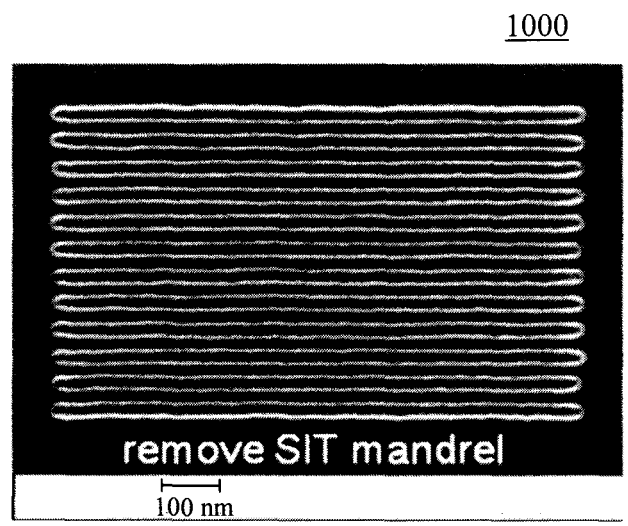
FIG. 10 is a top-down image of the SIT mandrels having been removed according to an embodiment of the present invention.

FIG. 10 is a top-down image 1000 of the SIT mandrels having been removed. As shown in FIG. 10, what remains are the SIT sidewall spacers.

Figure 11:
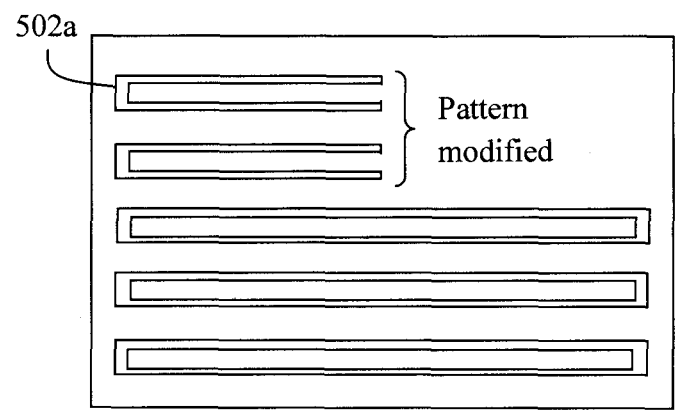
FIG. 11 is a top-down diagram illustrating an optional modification of a pattern of the SIT sidewall spacers having been performed according to an embodiment of the present invention.

Following removal of the SIT mandrels 106a, a pattern of the SIT sidewall spacers may be modified/customized as needed. This step is optional. For instance, the SIT sidewall spacers 502a may be used to pattern fins in the underlying substrate. See below. Depending on the desired device configuration, it might be preferable to modify/customize one or more of the SIT sidewall spacers so as to modify/customize one or more of the corresponding fins that are to be patterned. By way of example only, see FIG. 11, wherein the length of one or more of the SIT sidewall spacers has been altered (in this case reduced) thus altering the pattern of the SIT sidewall spacers. Modification of the pattern of the SIT sidewall spacers can be achieved using standard lithography techniques where a resist can be used as a mask, and an etching process (such as RIE) can be used to alter the pattern. FIG. 11 is a top-down view of the SIT sidewall spacer pattern.

Following removal of the SIT mandrels 106a and optional modification/optimization of the SIT sidewall spacer pattern, the SIT sidewall spacers 502a are then used to transfer the pattern to the hardmask material 104 and/or the substrate 102. See FIG. 12. In the exemplary embodiment shown in FIG. 12, the hardmask material 104, once patterned, is referred to hereinafter as patterned hardmask 104a. In this example, the pattern of the SIT sidewall spacers is first transferred to the hardmask material, forming the patterned hardmasks 104a. This step may be carried out using a RIE process. The patterned hardmasks 104a can then be used to pattern the substrate. Again a RIE process may be used to pattern the substrate. The particular etch chemistry used can be varied for etching selectivity between the hardmask and the substrate. Alternatively, as provided above, the use of a hardmask in this process flow is optional. Thus, in the instance where a hardmask is not employed, the pattern of the SIT sidewall spacers is at this step transferred directly into the stack or substrate (e.g., using RIE).

Figure 12:
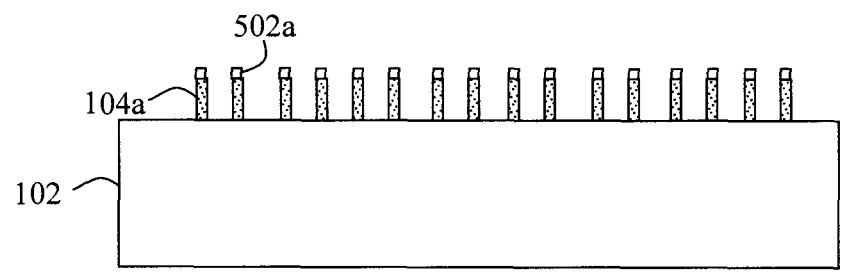
FIG. 12 is a cross-sectional diagram illustrating the SIT sidewall spacers having been used to transfer the pattern to the hardmask material and/or the substrate according to an embodiment of the present invention.
Figure 13:
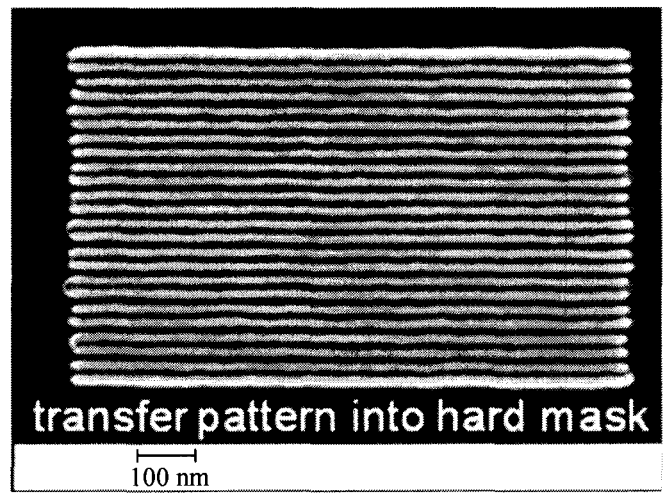
FIG. 13 is a top-down image of the pattern having been transferred to the hardmask material using the SIT sidewall spacers according to an embodiment of the present invention.

According to an exemplary embodiment, this patterning step is carried out using RIE. RIE will likely remove some (as shown in FIG. 12), or all of the SIT sidewall spacers 502a. If any portion(s) of the SIT sidewall spacers 502a remain, they may be removed at this point in the process. FIG. 13 is a top-down image 1300 of the pattern having been transferred to the hardmask material using the SIT sidewall spacers.

Figure 14:
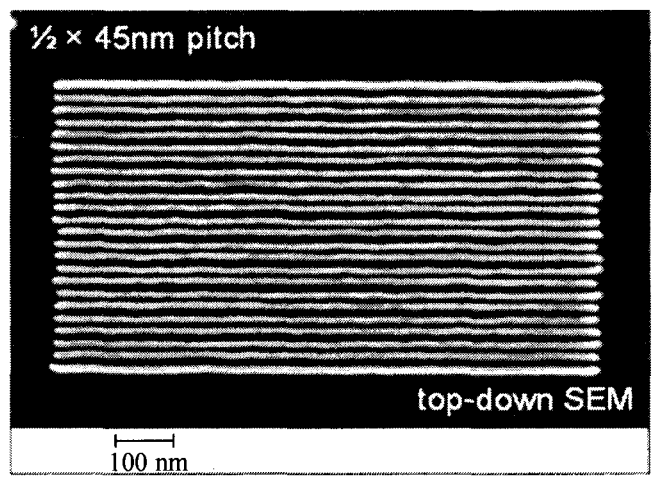
FIG. 14 is a top-down image of sample where the present techniques were used to transfer a pitch doubled pattern into a silicon substrate according to an embodiment of the present invention.
Figure 15:
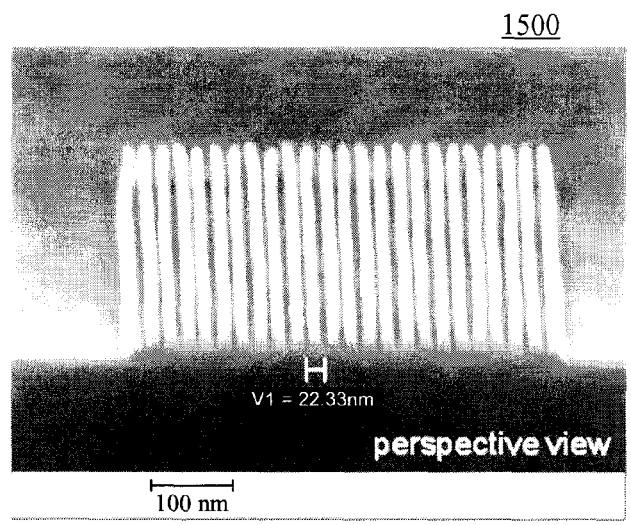
FIG. 15 is a perspective image of the sample of FIG. 14 according to an embodiment of the present invention.
Figure 16:
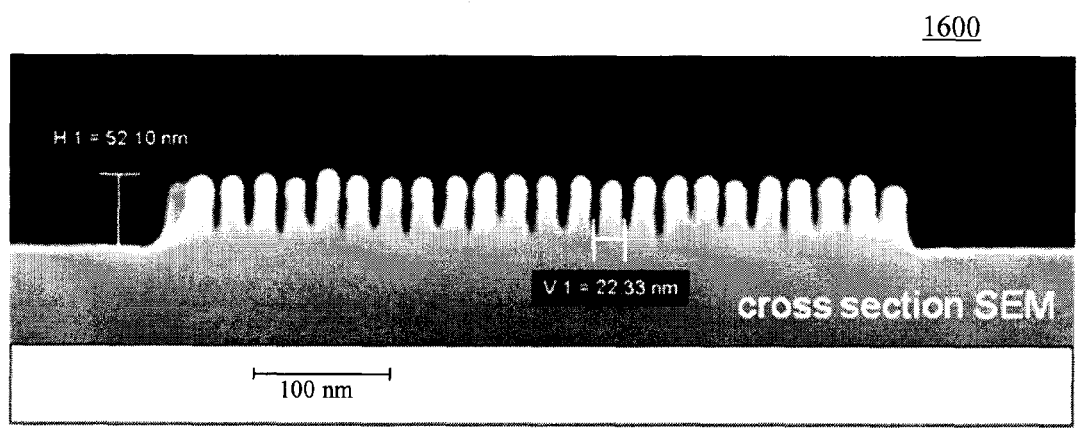
FIG. 16 is a cross-sectional image of the sample of FIG. 14 according to an embodiment of the present invention.

FIGS. 14-16 are images of an exemplary implementation where the present techniques were used to transfer a pitch doubled pattern into a silicon substrate. Specifically, the image shown in FIG. 14 is a top-down scanning electron micrograph (SEM) image 1400 of the sample. FIG. 15 is a perspective SEM view image 1500 of the same sample. And FIG. 16 is a cross-sectional SEM image 1600 also of the same sample.

Figure 17:
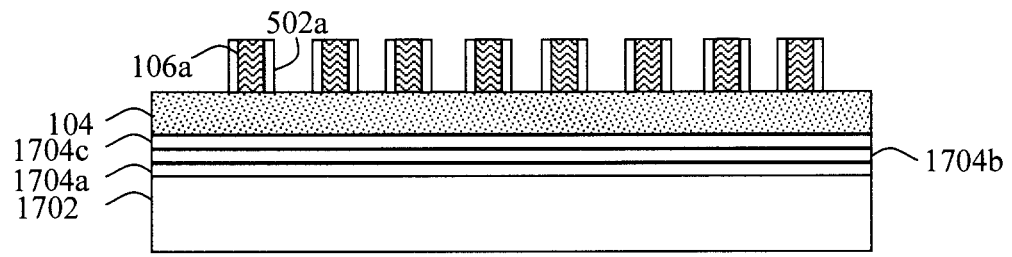
FIG. 17 is a cross-sectional diagram illustrating a starting structure for an exemplary implementation of the present SIT process for use in patterning a stack of thin films on a wafer having a hardmask material on the or stack, patterned SIT mandrels on the hardmask and spacers on the sidewalls of the SIT mandrels according to an embodiment of the present invention.

While it was described above that the starting structure for the present SIT process flow is a substrate which can generally include a wafer, such as an SOI wafer, a bulk semiconductor wafer and/or a wafer with a sequence of thin films (stack) deposited thereon, for illustrative purposes an exemplary embodiment is now described where the present SIT process is used to pattern a film stack. This example illustrates the versatility of the process for a variety of different device fabrication scenarios. Unless specifically mentioned, the process is the same as that described in conjunction with the description of FIGS. 1-13, above. Accordingly, the structure shown in FIG. 17 is achieved using the above-described processes, and like structures are numbered alike in the figures. The difference in this case is that the substrate (substrate 102 in FIG. 7, for example) is made up of a stack of thin films (1704a, 1704b, 1704c, etc.) on a wafer 1702. By way of example only, the stack of thin films can be a stack of the materials used in forming a gate stack over a semiconductor wafer 1702. For instance, thin film 1704a might be a gate dielectric material, thin film 1704b a liner material, thin film 1704c a gate electrode material (such as polysilicon), etc. Of course this is only one example of the films that can be included in the stack and any other configuration of film layers can be patterned according to the present techniques.

As described above, a thin film of a hardmask material 104 is deposited onto the substrate (in this case onto the stack of thin films), SIT mandrels 106a are formed (from an SIT mandrel material 106) based on a line pattern transferred from a patterned resist 108, and SIT sidewall spacers 502a are formed from a spacer material 502 on the sidewalls of the SIT mandrel 106a. These steps are performed in the same manner as described above.

Figure 18:
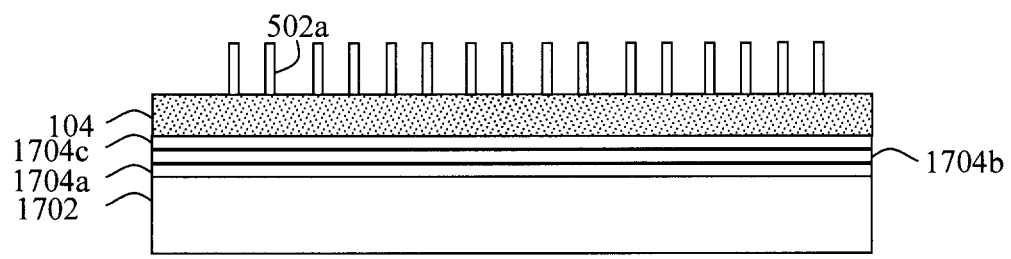
FIG. 18, which follows from FIG. 17, is a cross-sectional diagram illustrating the SIT mandrels having been removed selective to the SIT sidewall spacers according to an embodiment of the present invention.

In the same manner as described above, the SIT mandrels 106a are removed selective to the SIT sidewall spacers 502a. See FIG. 18. The result is that a pattern of the SIT sidewall spacers 502a is revealed. That pattern will be used to pattern the underlying stack of thin films—see below. As described, for example, in conjunction with the description of FIG. 11 above, a pattern of the SIT sidewall spacers may (optionally) be modified/customized if/as needed. Namely, depending on the desired device configuration, it might be preferable to modify/customize one or more of the SIT sidewall spacers so as to modify/customize one or more of the corresponding structures that are to be patterned in the stack of thin films (e.g., so as to produce a particular configuration of gate lines in the stack). As described above, this modification can be achieved, e.g., using standard lithography and etching techniques.

Next, in the same manner as described above, the SIT sidewall spacers 502a are used to transfer the pattern to the hardmask material 104 and (via the hardmask) to one or more of the layers in the stack of thin films (1704a, 1704b, 1704c, etc.). See FIG. 19. In the exemplary embodiment shown in FIG. 19, the hardmask material 104, once patterned, is referred to hereinafter as patterned hardmask 104a. In this example, the pattern of the SIT sidewall spacers is first transferred to the hardmask material, forming the patterned hardmasks 104a. This step may be carried out using a RIE process. The patterned hardmasks 104a can then be used to pattern one or more of the layers in the stack of thin films. Again a RIE process may be used to pattern the stack. The particular etch chemistry used can be varied for etching selectivity between the hardmask and the thin films and/or for etching selectivity between the various layers in the stack.

For example, depending on the configuration of the thin film layers in the stack and the device being fabricated, it may be desirable to etch the pattern into only some (but not all) of the layers in the stack. Determining the particular etch chemistries for selectively etching the layers in the thin film stack for a given device application would be within the capabilities of one skilled in the art.

Alternatively, it may be desirable to etch the pattern into all of the layers of the stack of thin films. For instance in the example shown in FIG. 19, the SIT mandrel pattern is etched into each of the thin film layers (1704a, 1704b, 1704c, etc.) in the stack. In this example, the RIE step(s) used to etch the thin films is/are endpointed on the wafer 1702 which serves as an etch stop. The result is etched thin film layers 1704a', 1704b', 1704c', etc., respectively. By way of example only, when the present techniques are being employed to form gate stacks from the stack of thin films (see above) it may be desirable to—as in the manner shown in FIG. 19—etch the mandrel pattern into each layer in the stack of thin films resulting, for example, in a discrete gate dielectric, liner and gate electrode in each gate stack.

It is noted that, as provided above, the use of a hardmask in this process flow is optional. Thus, in the instance where a hardmask is not employed, the pattern of the SIT sidewall spacers is at this step transferred directly into the stack (e.g., using RIE).

Figure 19:
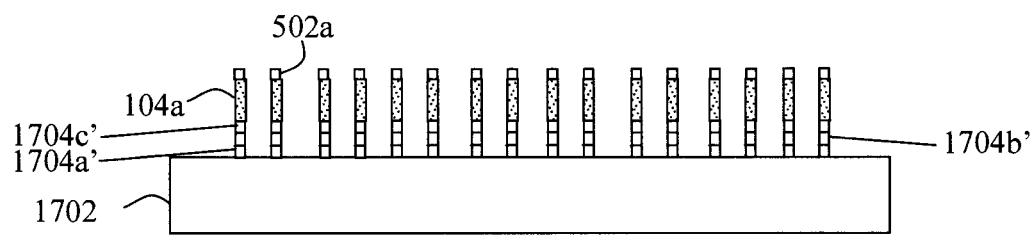
FIG. 19 is a cross-sectional diagram illustrating the SIT sidewall spacers having been used to transfer their pattern to the hardmask material and (via the hardmask) to one or more of the layers in the stack of thin films according to an embodiment of the present invention.

According to an exemplary embodiment, this patterning step is carried out using RIE. RIE will likely remove some (as shown in FIG. 19), or all of the SIT sidewall spacers 502a. If any portion(s) of the SIT sidewall spacers 502a remain, they may be removed at this point in the process.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A Sidewall Image Transfer (SIT) method, the method comprising the steps of:
   depositing an SIT mandrel material directly onto a substrate comprising a hardmask material, the SIT mandrel material being a silicon material etched selective to the substrate;
   forming a patterned resist on the SIT mandrel material, wherein the patterned resist has a line pattern defined therein;
   transferring the line pattern from the patterned resist to the SIT mandrel material, forming a plurality of SIT mandrels;
   conformally depositing a spacer material directly onto the substrate and covering a top and sides of each of the SIT mandrels, wherein the spacer material is selected from the group consisting of a metal, a metal oxide, a metal nitride and combinations comprising at least one of the foregoing materials;
   removing the spacer material from all but the sides of each of the SIT mandrels to form SIT sidewall spacers on the sides of each of the SIT mandrels;
   removing the SIT mandrels selective to the SIT sidewall spacers revealing a pattern of the SIT sidewall spacers;
   modifying the pattern of the SIT sidewall spacers following removal of the SIT mandrels, wherein the step of modifying the pattern of the SIT sidewall spacers comprises reducing a length of one or more of the SIT sidewall spacers; and
   transferring the pattern of the SIT sidewall spacers to the substrate comprising the hardmask material,
   wherein the spacer material comprises a metal selected from the group consisting of platinum, ruthenium, iron, nickel, and combinations comprising at least one of the foregoing metals.

2. The method of claim 1, wherein the substrate comprises a silicon-on-insulator wafer or a bulk semiconductor wafer.

3. The method of claim 1, wherein the SIT mandrel material comprises an oxide material.

4. The method of claim 1, wherein the line pattern is transferred from the patterned resist to the SIT mandrel material using reactive ion etching and the transferring is of the modified pattern of the SIT sidewall spacers.

5. The method of claim 1, further comprising the step of:
   removing any remaining portion of the patterned resist after the line pattern has been transferred to the SIT mandrel material.

6. The method of claim 1, wherein the spacer material is conformally deposited onto the substrate using atomic layer deposition at a temperature of less than or equal to about 550° C.

7. The method of claim 1, wherein the spacer material further comprises a metal oxide selected from the group consisting of: aluminum oxide, titanium oxide, tantalum oxide, hafnium oxide, zirconium oxide, tin oxide, zinc oxide, magnesium oxide, niobium oxide, lanthanum oxide, cobalt oxide, and combinations comprising at least one of the foregoing metal oxides.

8. The method of claim 1, wherein the spacer material further comprises a metal nitride selected from the group consisting of: titanium nitride, tantalum nitride, hafnium nitride, zirconium nitride, tungsten nitride, niobium nitride, and combinations comprising at least one of the foregoing metal nitrides.

9. The method of claim 1, wherein the spacer material is removed from all but the sides of each of the SIT mandrels using an anisotropic etching process.

10. The method of claim 1, wherein the SIT mandrels are removed selective to the SIT sidewall spacers using a wet etching or a dry etching process.

11. The method of claim 1, further comprising the step of:
removing any remaining portion of the SIT sidewall spacers after the pattern of the SIT sidewall spacers has been transferred to the substrate.

12. The method of claim 1, further comprising the steps of:
depositing a hardmask material onto the substrate; and
depositing the SIT mandrel material onto the hardmask material.

13. The method of claim 12, wherein the hardmask material comprises a nitride material.

14. The method of claim 12, further comprising the step of:
transferring the pattern of the SIT sidewall spacers to the hardmask material forming a plurality of patterned hardmasks.

15. The method of claim 14, further comprising the step of:
using the patterned hardmasks to pattern the substrate.

16. The method of claim 1, wherein the spacer material is conformally deposited onto the substrate using atomic layer deposition and the SIT mandrel material is formed having a component comprising an oxide.

17. A SIT method, the method comprising the steps of:
depositing an SIT mandrel material directly onto a stack of thin films comprising a hardmask material, the SIT mandrel material being a silicon material etched selective to the stack of thin films;
forming a patterned resist on the SIT mandrel material, wherein the patterned resist has a line pattern defined therein;
transferring the line pattern from the patterned resist to the SIT mandrel material, forming a plurality of SIT mandrels;
conformally depositing a spacer material directly onto the stack of thin films and covering a top and sides of each of the SIT mandrels, wherein the spacer material is selected from the group consisting of a metal, a metal oxide, a metal nitride and combinations comprising at least one of the foregoing materials;
removing the spacer material from all but the sides of each of the SIT mandrels to form SIT sidewall spacers on the sides of each of the SIT mandrels;
removing the SIT mandrels selective to the SIT sidewall spacers revealing a pattern of the SIT sidewall spacers;
modifying the pattern of the SIT sidewall spacers following removal of the SIT mandrels, wherein the step of modifying the pattern of the SIT sidewall spacers comprises reducing a length of one or more of the SIT sidewall spacers; and
transferring the pattern of the SIT sidewall spacers to one or more layers in the stack of thin films comprising the hardmask material,
wherein the spacer material comprises a metal selected from the group consisting of platinum, ruthenium, iron, nickel, and combinations comprising at least one of the foregoing metals.

18. The method of claim 17, further comprising the steps of:
depositing a hardmask material onto the stack of thin films;
depositing the SIT mandrel material onto the hardmask material; and
transferring the pattern of the SIT sidewall spacers to the hardmask material forming a plurality of patterned hardmasks.

19. The method of claim 17, wherein the spacer material is conformally deposited onto the stack of thin films using atomic layer deposition and the SIT mandrel material is formed having a component comprising an oxide.

* * * * *